US012597923B2

(12) United States Patent
Verhoef et al.

(10) Patent No.: US 12,597,923 B2
(45) Date of Patent: Apr. 7, 2026

(54) HIGH PERFORMANCE LOW BIAS CURRENT OUTPUT DRIVER IN HIGH VOLTAGE ENVIRONMENT

(71) Applicant: Renesas Design Netherlands B.V., 's-Hertogenbosch (NL)

(72) Inventors: Bram Verhoef, Diepenheim (NL); Marc Beney, Utrecht (NL)

(73) Assignee: Renesas Design Netherlands B.V., 's-Hertogenbosch (NL)

( * ) Notice: Subject to any disclaimer, the term of this patent is extended or adjusted under 35 U.S.C. 154(b) by 0 days.

(21) Appl. No.: 18/755,839

(22) Filed: Jun. 27, 2024

(65) Prior Publication Data

US 2026/0005689 A1     Jan. 1, 2026

(51) Int. Cl.
*H03K 17/06* (2006.01)
*H03K 17/687* (2006.01)

(52) U.S. Cl.
CPC ......... *H03K 17/687* (2013.01); *H03K 17/063* (2013.01)

(58) Field of Classification Search
CPC . H03K 17/063; H03K 17/687; H03K 17/6871
USPC ................................................ 327/108, 109
See application file for complete search history.

(56) References Cited

U.S. PATENT DOCUMENTS

| | | | | |
|---|---|---|---|---|
| 6,529,359 B1 * | 3/2003 | Verhaege | ......... | H03K 19/00315 |
| | | | | 361/100 |
| 2002/0008251 A1 * | 1/2002 | Galli | ................ | H03K 19/01721 |
| | | | | 257/200 |
| 2006/0170451 A1 * | 8/2006 | Jordanger | ........ | H03K 19/00346 |
| | | | | 326/34 |
| 2010/0164447 A1 * | 7/2010 | Masleid | ......... | H03K 19/018521 |
| | | | | 323/282 |

* cited by examiner

*Primary Examiner* — William Hernandez
(74) *Attorney, Agent, or Firm* — SCULLY, SCOTT, MURPHY & PRESSER, P.C.

(57) ABSTRACT

An integrated circuit is provided. The integrated circuit includes a central processing unit built to process data and an output pin of the integrated circuit to provide processed data at the output pin to an external device connected to the output pin and a driver for the output pin with an output MOSFET of the driver connected to the output pin to provide the processed data with the power specified for the output pin. The driver includes a dynamic driver stage built to switch the output MOSFET between its conductive and non-conductive condition and a static driver stage built to maintain the condition of the output MOSFET until the dynamic driver stage switches the condition.

10 Claims, 5 Drawing Sheets

Initial charge surge drom decap    Prior Art

HSGND regulator restores voltage

Prior Art

+ Fast $V_{HSGND}$ recovery
+ High operating frequency
- High power
- Large $C_{HSGND}$ -> Large Die Area

- Slow $V_{HSGND}$ recovery
- Low operating frequency
+ Low power
+ Small $C_{HSGND}$ -> Small Die Area

HIGH PERFORMANCE LOW BIAS CURRENT OUTPUT DRIVER IN HIGH VOLTAGE ENVIRONMENT

FIELD

The presented disclosure relates to an integrated circuit for processing of data.

BACKGROUND

Known integrated circuits for processing of data are for instance integrated circuits for audio or video or computer applications, just to name some examples. A central processing unit of the integrated circuit is used to process data and one or more output pins are used for a wired communication with other integrated circuits in the same device or other devices to communicate the processed digital data as a processed data signal. A driver for one or more of these output pins is used to provide the processed data signal with the power specified for the output pin. A general purpose output pin for instance provides a processed data signal with an output voltage of 5 Volt and an output current of 10 mA maximum, just to give one example. These drivers quite often comprise an output MOSFET of the driver connected to the output pin to deliver this specified power.

FIG. 1 shows a circuitry and time diagram of a prior art driver 1 for an output pin 2 of an integrated circuit 3, that is powered by supply voltage $V_{BAT}$. A high side ground generation stage 4 is used to generate a high side ground voltage $V_{HSGND}$ of for instance 1.8 Volt with respect to $V_{BAT}$ based on a reference voltage VREF as input voltage for a driver stage 5. A level shifter 6 is used to shift the voltage level of the digital processed data signal D (internal in the integrated circuit 3) to the input voltage level of driver stage 5. Based on the processed data signal D, output PMOS MPo will be switched-ON at a switch-on time $T_1$ or switched-OFF at a switch-off time $T_2$. High side ground voltage $V_{HSGND}$ generated by high side ground generation stage 4 provides the drive energy for the gate drive of output PMOS MPo. When processed data signal D at switch-on time $T_1$ goes high and output PMOS MPo is turned-ON, a step charge is presented to HSGND (gate capacitance of output PMOS MPo). The step charge causes a rapid discharge of a capacitor $C_{HSGND}$, as shown by the arrow from the circuitry to the time diagram. Once output PMOS MPo is fully switched ON, the charge on HSGND drops and the high side ground generation stage 4 eventually restores high side ground voltage $V_{HSGND}$. The severity of the discharge of high side ground voltage $V_{HSGND}$ and the time it takes to restore the high side ground voltage $V_{HSGND}$ is determined by the size of the capacitor $C_{HSGND}$ and the bias current of the high side ground voltage generation stage 4.

It is important to note that the high side ground voltage $V_{HSGND}$ needs to be restored before the next data cycle of processed data signal D can be initiated, having a direct bearing on the maximum data rate that can be supported.

Data rates between integrated circuits continue to rise. At the same time, greater integration is placing greater demands for low power circuits that require less die area. Unfortunately, prior art solutions like driver 1 shown in FIG. 1 require a compromise between data rate (speed) and power consumption and die area.

FIG. 2 illustrates the design trade-off of prior art driver 1. Since high side ground voltage $V_{HSGND}$ must be fully recovered before the next data cycle is initiated, supporting higher data rates demands high side ground voltage $V_{HSGND}$ recovery time is minimized, thus requiring higher power consumption of the high side ground generation stage 4. To replenish the high side ground voltage $V_{HSGND}$, a higher bias current $I_B$ is needed. A larger capacitance of capacity $C_{HSGND}$ is needed to be able to switch ON output PMOS MPo quickly, as shown in the upper part of the time diagram in FIG. 2, compared to the lower part of the time diagram with a smaller capacitance of capacity $C_{HSGND}$. Unfortunately, for prior art designs, higher-speed operation results in large silicon die area and higher power consumption.

FIG. 3 illustrates the limitations of the prior art and highlights the trade-off between high frequency operating and power consumption and die area of the integrated circuit 3. Furthermore, this becomes more problematic as the number of drivers that are operated in parallel increases.

SUMMARY

It is an object of an aspect of the disclosure to provide an integrated circuit with an output driver supporting high data rates, while minimizing power consumption and die area. This object is achieved with an integrated circuit as claimed in claim 1 and with a method as claimed in claim 6.

FIG. 4 discloses the principle difference between the prior art driver 1, as disclosed in FIG. 1, to drive output PMOS MPo and an inventive integrated circuit with a driver 7 to drive output PMOS MPo. Driver 7 comprises a dynamic driver stage 8, built to switch the output PMOS MPo between its conductive and non-conductive condition, and a static driver stage 9, built to maintain the condition of the output PMOS MPo until the dynamic driver stage 8 switches the condition again. The detailed function of driver 7 will be explained based on FIGS. 5-7. The big advantage of this driver 7 is that it needs a lower supply current (lower power) and die area even for higher operating frequencies of the integrated circuit as can be seen in FIG. 8.

These and other aspects of the disclosure will be apparent from and elucidated with reference to the embodiments described hereinafter. The person skilled in the art will understand that various embodiments may be combined.

DETAILED DESCRIPTION OF EMBODIMENTS

Figure 5:
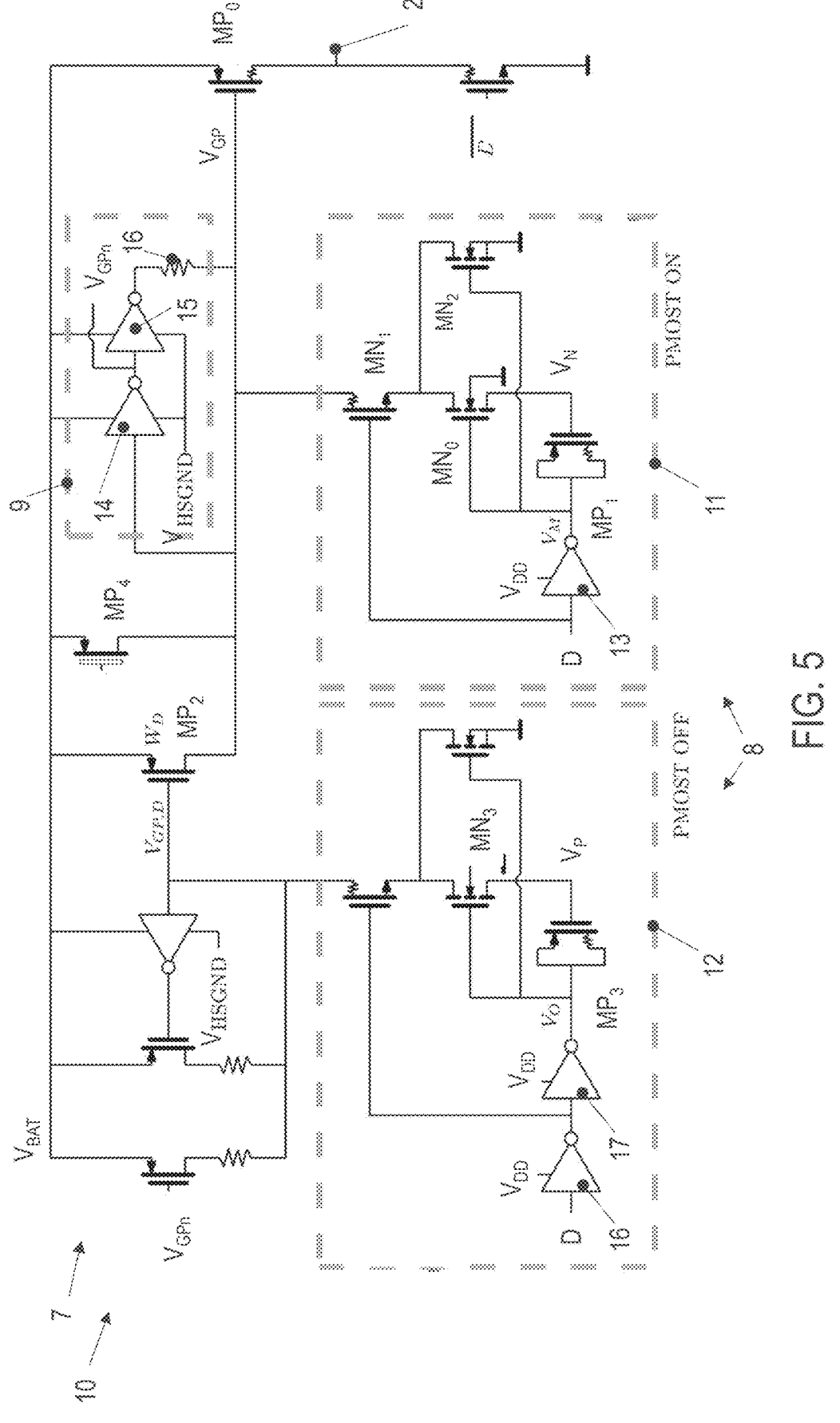
FIG. 5 shows an integrated circuit with a driver according to the disclosure.

FIG. 5 shows an integrated circuit 10 according to one embodiment of the invention for processing of a data signal that represents digital data with bits "0" and "1", which integrated circuit 10 could be used in any kind of technology area like for instance for processing of audio data or video data. Integrated circuit 10 comprises a central processing unit, not shown in FIG. 5, built to process the digital data and might comprise an internal or external memory to store processed digital data. Integrated circuit 10 furthermore comprises one or more output pins 2 of the integrated circuit 10 to provide the processed digital data as a processed data signal D at the output pin 2 to an external device connected to the output pin 2. The external device could for instance be another integrated circuit of the same audio player or for instance a computer that receives the processed data signal D on a wired bus like the Universal Serial Bus.

Integrated circuit 10 furthermore comprises driver 7 for the output pin 2 with a p-channel type MOSFET called output PMOS MPo of the driver 7 connected with its drain contact to the output pin 2 to provide the processed data signal D with the power specified for the output pin 2. A general purpose output pin for instance provides the processed data signal D with an output voltage of 5 Volt and an output current of 10 mA maximum, just to give one example.

In general, driver 7 of integrated circuit 10 combines both a dynamic energy source that rapidly provides gate drive to the output PMOS MPo, when the processed data signal D goes HIGH, and a static energy source that provides a regulated voltage to maintain the ON state of the output PMOS MPo transistor. This allows for the fast switch-ON of the output PMOS MPo transistor without requiring a capacitor $C_{HSGND}$ with a large capacity.

Figure 6:
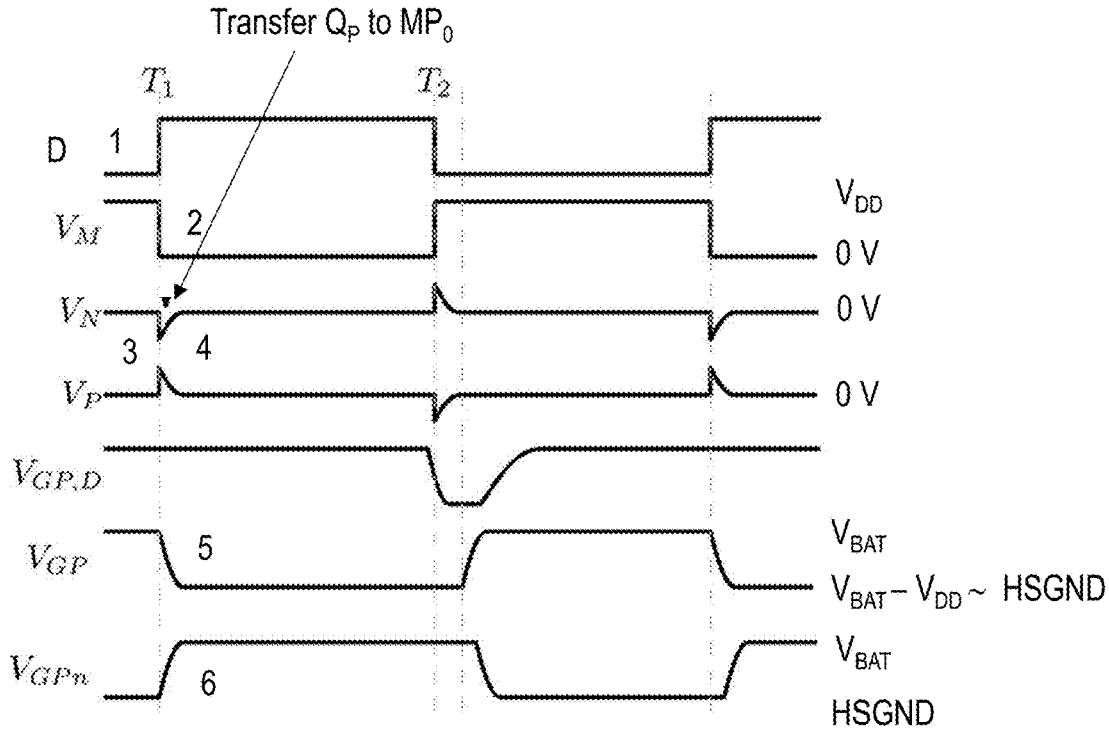
FIG. 6 shows the sequence of events that take place in a dynamic switch-on stage of the dynamic driver stage of FIG. 5.
Figure 7:
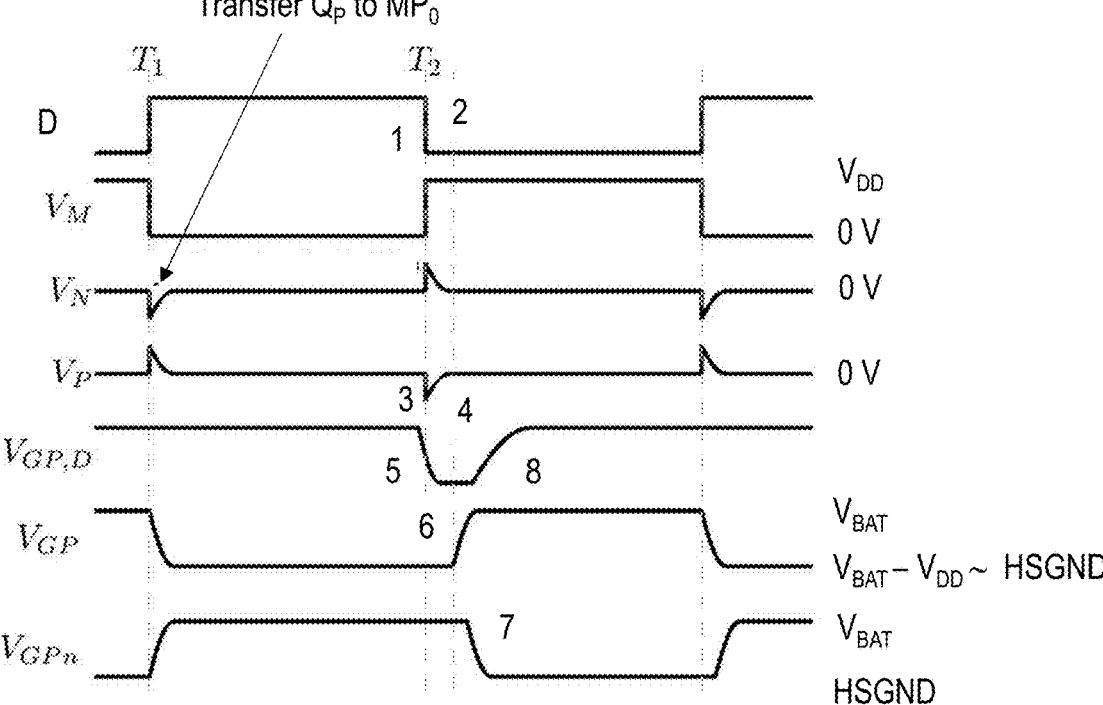
FIG. 7 shows the sequence of events that take place in a dynamic switch-off stage of the dynamic driver stage of FIG. 5.

To achieve this driver 7 of integrated circuit 10 comprises a dynamic driver stage 8 built to switch the output PMOS MPo between its conductive and non-conductive condition and a static driver stage 9 built to maintain the condition of the output PMOS MPo until the dynamic driver stage 8 again switches the condition. Dynamic driver stage 8 comprises a dynamic switch-on stage 11 to switch the output PMOS MPo from its non-conductive condition into its conductive condition at a switch-on time $T_1$ at the occurrence of a positive edge of the processed data signal D, as shown in FIGS. 6 and 7. Dynamic driver stage 8 furthermore comprises a dynamic switch-off stage 12 to switch the output PMOS MPo from its conductive condition into its non-conductive condition at a switch-off time $T_2$ at the occurrence of a negative edge of the processed data signal D, as shown in FIGS. 6 and 7. These two dedicated circuits of the dynamic driver stage 8 ensure accurate and energy saving switching of the output PMOS MPo, as will be explained below.

Dynamic switch-on stage 11 comprises a first PMOS $MP_1$ of the same technology as the output PMOS MPo with the source contact and drain contact of the first PMOS $MP_1$ connected to the output of a first inverter 13 of the dynamic switch-on stage 11. First inverter 13 at its input receives the processed data signal D from the central processing unit or any other processing stage of the integrated circuit 10 and is supplied by a voltage $V_{DD}$. This structure of the dynamic switch-on stage 11 enables that the charge stored in the capacity of the first PMOS $MP_1$ at switch-on time $T_1$ is used to charge the capacity of the output PMOS MPo at its gate contact to switch the output PMOS MPo into its conducting condition, as will be explained based on FIG. 6.

FIG. 6 shows the operating timing waveforms of the dynamic switch-on stage 11 of the integrated circuit 10 shown in FIG. 5. Processed data signal D is shown as first waveform with the positive edge at switch-on time $T_1$ and the negative edge at switch-off time $T_2$. The function of the dynamic switch-on stage 11 will be explained with a sequence of six steps, which are numbered in the operating timing waveforms of FIG. 6 as well. The positive edge of the processed data signal D at switch-on time $T_1$ causes the following sequence:

Step 1: First PMOS $MP_1$ with its source contact and drain contact connected hold a charge in its gate capacity of $QP=V_{DD}*CG,MP_1$, which is the same charge needed to charge the capacity of the output PMOS MPo at its gate contact to switch the output PMOS MPo into its conducting condition as both transistors are built with the same technology.

Step 2: Voltage $V_M$ at the output of the first inverter 13 switches to 0V.

Step 3: Voltage $V_N$ at the gate contact of first PMOS $MP_1$ is pulled below GND (0V).

Step 4: n-channel NMOS MNo connected to the gate contact of first PMOS $MP_1$ is switched on at its gate contact by falling edge of voltage $V_M$ at the output of the first inverter 13 and conducts until $V_N=0V$, which causes that charge QP flows from the voltage $V_{GP}$ at the gate contact of output PMOS MPo via a n-channel first MMOS $MN_1$.

Step 5: Voltage $V_{GP}$ at the gate contact of output PMOS MPo drops to $V_{BAT}-V_{DD}$ and switches output PMOS MPo into its conducting condition.

Step 6: Static driver stage 9 keeps output PMOS MPo in its conducting condition with a weak latch to a high side ground voltage $V_{HSGND}$, what will be explained below.

Static driver stage 9 comprises a second inverter 14 connected with its input to the gate contact of the output PMOS MPo and connected with its output to the input of a third inverter 15, which third inverter 15 is connected with its output via a resistor 16 to the gate contact of the output PMOS MPo. The second inverter 14 and the third inverter 15 switch between a positive supply voltage level $V_{BAT}$ of e.g., 5 Volt and a high side ground voltage $V_{HSGND}$ with $V_{HSGND}$ being more or less $V_{BAT}$ minus the reference voltage level $V_{DD}$ smaller than the positive supply voltage level $V_{BAT}$. The high side ground voltage $V_{HSGND}$ might be fixed at 1.8 Volt below $V_{BAT}$, just to give one example. This circuitry of the static driver stage 9 ensures a weak connection to the high side ground voltage $V_{HSGND}$. This operation does not require additional bias current as prior art drivers. Once output PMOS MPo is switched to its conductive condition, the static driver stage 9 maintains the conductive condition. As compared to prior art, the high side ground voltage $V_{HSGND}$ source does not provide the energy to initiate switching the output PMOS MPo into its conductive condition. The high side ground generation stage that provides the high side ground voltage $V_{HSGND}$ only needs to provide a very low current source in the order of ~6 nA per driver 7 which can be delivered by a voltage reference circuit. Therefore, it does not require a large $C_{HSGND}$ capacitor to facilitate fast response of the high side ground voltage $V_{HSGND}$. Generally, prior art driver required the $C_{HSGND}$ capacitor to be significantly larger than the gate capacitance of both output PMOS MPo and first PMOS $MP_1$ to absorb current transient, requiring large die area, especially considering that each driver 7 might require individual high side ground generation stages.

To provide high frequency operation, it is equally important to facilitate a fast switch-OFF of output PMOS MPo what means to switch output PMOS MPo from its conductive into its non-conductive condition. To achieve this, dynamic driver stage 8 of integrated circuit 10 comprises dynamic switch-off stage 12, which is built to steer a p-channel second PMOS $MP_2$ of the driver stage 7 connected to the gate contact of the output PMOS MPo into its conductive condition to discharge the capacity of the output PMOS MPo at its gate contact to switch the output PMOS MPo into its non-conductive condition.

FIG. 7 shows the operating timing waveforms of the dynamic switch-off stage 12 of the integrated circuit 10 shown in FIG. 5. Processed data signal D is shown as first waveform with the positive edge at switch-on time $T_1$ and the negative edge at switch-off time $T_2$. The function of the dynamic switch-off stage 12 will be explained with a sequence of eight steps which are numbered in the operating timing waveforms of FIG. 7 as well. The negative edge of the processed data signal D at switch-off time $T_2$ causes the following sequence:

Step 1: A third p-channel PMOS $MP_3$ with its source contact and drain contact connected holds a charge in its gate capacity of $QP=V_{DD}*CG,MP_3$, which is the same charge as second PMOS $MP_2$ needs to switch its conductive condition $QD=V_{DD}*CG, MP_2$, as both transistors are built with the same technology.

Step 2: Processed data signal D at switch-off time $T_2$ switches to 0V, which is the input of a fourth inverter 16 connected to a fifth inverter 17.

Step 3: Voltage $V_P$ at the gate contact of third PMOS $MP_3$ pulled below GND (0V).

Step 4: A third n-channel NMOS $MN_3$ conducts until Voltage $V_P=0V$ what leads to the result that charge QP flows from Voltage $V_{GP,D}$ at the gate contact of the PMOS $MP_2$.

Step 5: Voltage $V_{GP,D}$ at the gate contact of the second PMOS $MP_2$ drops to $V_{BAT}-V_{DD}$.

Step 6: Voltage $V_{GP}$ at the gate contact of the output PMOS MPo discharges to $V_{BAT}$ and switches the output PMOS MPo into its non-conductive condition.

Step 7: Static driver stage 9 keeps output PMOS MPo in its non-conductive condition with a weak latch to high side ground voltage $V_{HSGND}$, Voltage $V_{GPn}=V_{HSGND}$ Step 8: Voltage $V_{GP,D}$ at the gate contact of the second PMOS $MP_2$ discharges to supply voltage $V_{BAT}$.

The following summarizes the improvements of the embodiments of the invention as compared to prior art: Driver 7 according to the invention requires much lower power to operate at both high and low frequency operation, as well as not requiring large energy storage devices that consume large die area.

Figures 1, 2:
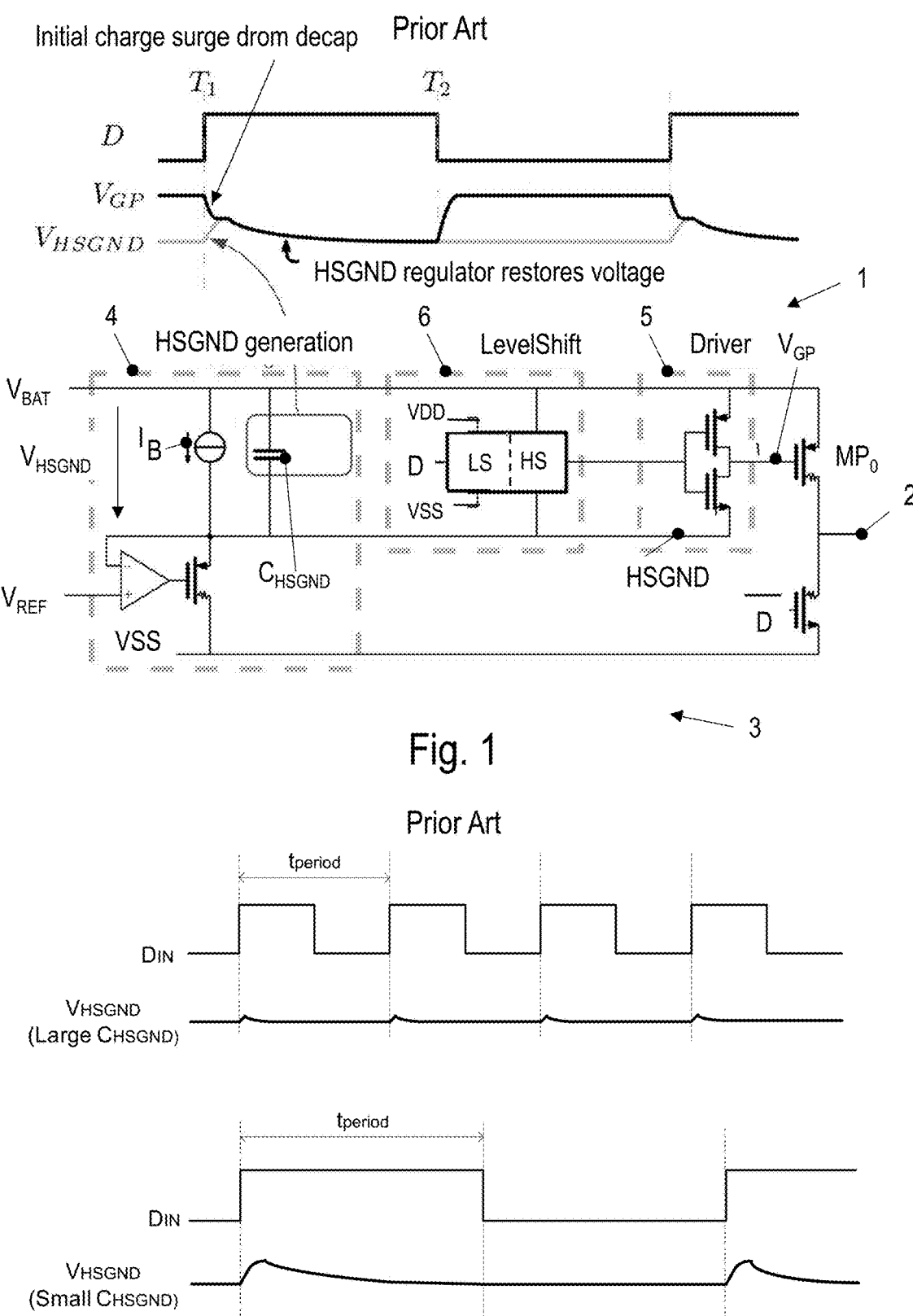
FIG. 1 shows a circuitry and time diagram of a prior art driver for an output pin of an integrated circuit.
FIG. 2 shows a time diagram of a driver of FIG. 1 with a larger and a smaller capacitance in the high side ground generation stage.
Figure 3:
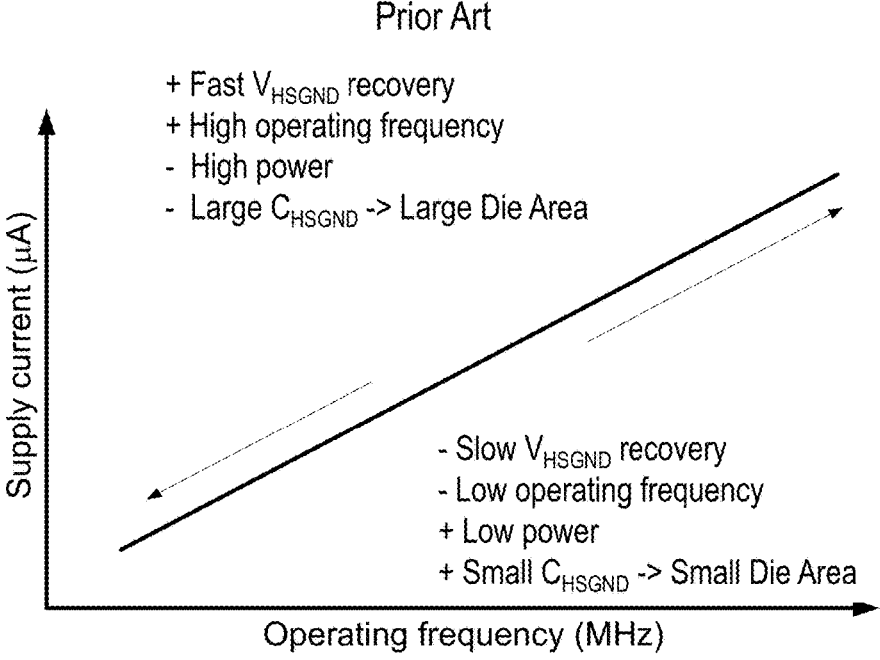
FIG. 3 shows the design trade-off for prior art driver of FIG. 1 with regard to data rates and power consumption and die area.
Figure 4:
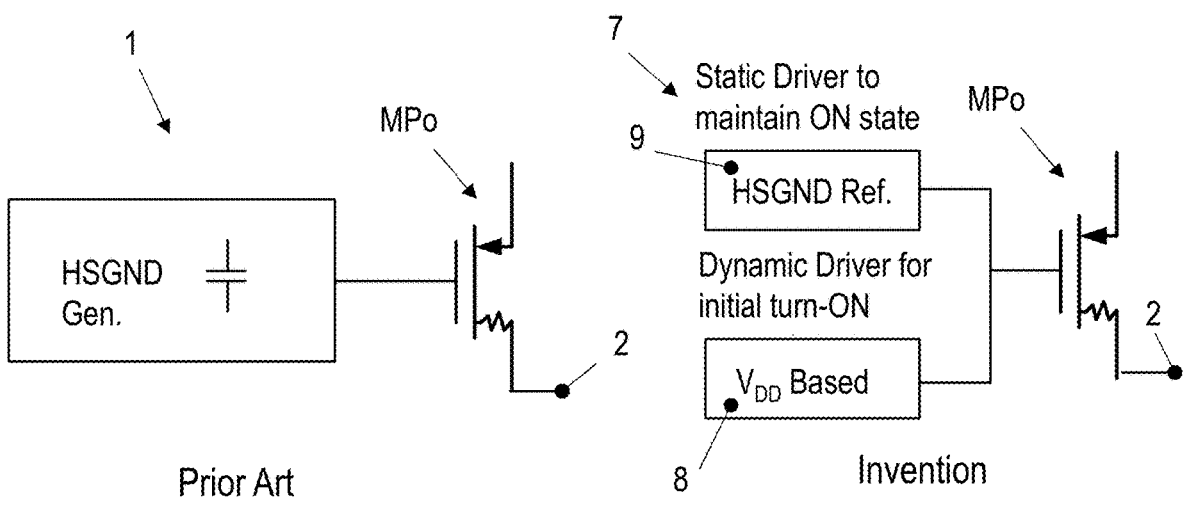
FIG. 4 shows the principle difference between prior art driver of FIG. 1 and an inventive driver of FIG. 5.

Prior art driver as shown in FIG. 1 comprises the disadvantage that the high side ground generation stage needs to drive and restore the charge at the output PMOS MPo. Furthermore for higher speed operation, power is increased significantly. Furthermore if high-speed implementation is used at low speed, operation is inefficient (high-power consumption of the regulator of the high side ground generation stage). Furthermore it requires large capacity $C_{HSGND}$ for fast high side ground voltage $V_{HSGND}$ recovery what leads to a large die area per driver.

The inventive driver 7 as shown in FIG. 5 comprises the advantage that the high side ground voltage $V_{HSGND}$ is a reference signal that is virtually discharged. Furthermore that the high side ground generation stage typically takes only a few nano Ampere and does not depend on operating frequency. Furthermore that the invention supports a wide range of operating frequencies without power penalty. Furthermore that driver 7 does not require large capacity $C_{HSGND}$ capacitor.

Figure 8:
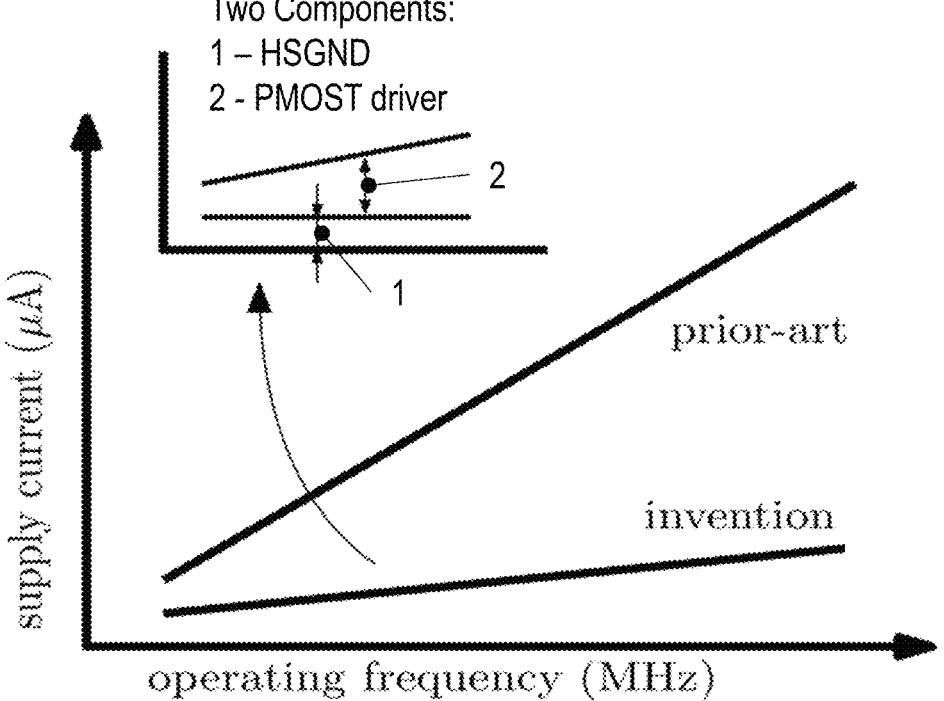
FIG. 8 shows advantages of the inventive driver shown in FIG. 5 compared to the prior art driver of FIG. 1.

FIG. 8 shows advantages of the inventive driver 7 shown in FIG. 5 compared to the prior art driver of FIG. 1.

With above explanation of driver 7 a method is disclosed for providing a processed data signal D, processed by the integrated circuit 10 at output pin 2 of the integrated circuit 10 with the power specified for the output pin 2 of the integrated circuit 10, wherein the method comprises the following steps:

Use the charge QP stored in the capacity of a first PMOS $MP_1$ of the dynamic switch-on stage 8 to charge the capacity of a output PMOS MPo at its gate contact to switch the output PMOS MPo at the output pin 2 from its non-conductive condition into its conductive condition at a switch-on time $T_1$ at the occurrence of a positive edge of the processed data signal D;

Maintain the condition of the output PMOS MPo with the static driver stage 9 until the dynamic driver stage 8 switches the condition again;

Use a dynamic switch-off stage 12 to discharge the capacity of the output PMOS MPo at its the gate contact to switch the output PMOS MPo at the output pin 2 from its conductive condition into its non-conductive condition at the switch-off time $T_2$ at the occurrence of a negative edge of the processed data signal D.

In another embodiment of the invention n-channel MOSFETS and p-channel MOSFETS and polarities of voltages may be exchanged to provide an equivalent functionality of driver 7.

An embodiment of the invention furthermore can be used in (switched-mode) power conversion or audio amplification or haptic drivers or any other similar application realized with an integrated circuit wherein a person skilled in the art would like to achieve the inventive advantages.

1. Integrated circuit (10) for processing of data, which integrated circuit comprises: a central processing unit built to process data;

an output pin (2) of the integrated circuit (10) to provide processed data (D) at the output pin (2) to an external device connected to the output pin (2);

a driver (7) for the output pin (2) with an output MOSFET (MPo) of the driver (7) connected to the output pin (2) to provide the processed data (D) with the power specified for the output pin (2), characterized in, that the driver (7) comprises a dynamic driver stage (8) built to switch the output MOSFET (MPo) between its conductive and non-conductive condition and a static driver stage (9) built to maintain the condition of the output MOSFET (MPo) until the dynamic driver stage (8) switches the condition.

2. Integrated circuit (10) according to claim 1, wherein the dynamic driver stage (8) comprises a dynamic switch-on stage (11) to switch the output MOSFET (MPo) from its non-conductive condition into its conductive condition at a switch-on time ($T_1$) at the occurrence of a positive edge of the processed data (D) and wherein the dynamic driver stage (8) comprises a dynamic switch-off stage (12) to switch the output MOSFET (MPo) from its conductive condition into its non-conductive condition at a switch-off time ($T_2$) at the occurrence of a negative edge of the processed data (D).

3. Integrated circuit (10) according to claim 2, wherein the dynamic switch-on stage (11) comprises a first MOSFET ($MP_1$) of the same technology as the output MOSFET (MPo) with the source contact and drain contact of the first MOSFET (MP$_1$) connected to the output of a first inverter (13) of the dynamic switch-on stage (11), which first inverter (13) at its input receives the processed data (D) and wherein the charge stored in the capacity of the first MOSFET (MP$_1$) at switch-on time (T$_1$) is used to charge the capacity of the output MOSFET (MPo) at its gate contact to switch the output MOSFET (MPo) into its conducting condition.

4. Integrated circuit (10) according to any of the claim 2 or 3, wherein the dynamic switch-off stage (12) is built to steer a second MOSFET (MP$_2$) of the driver stage (7) connected to the gate contact of the output MOSFET (MPo) into its conductive condition to discharge the capacity of the output MOSFET (MPo) at its gate contact to switch the output MOSFET (MPo) into its non-conductive condition.

5. Integrated circuit (10) according to any of the claims 1 to 4, wherein the static driver stage (9) comprises a second inverter (14) connected with its input to the gate contact of the output MOSFET (MPo) and connected with its output to the input of a third inverter (15), which third inverter (15) is connected with its output via a resistor (16) to the gate contact of the output MOSFET (MPo), wherein the second inverter (14) and the third inverter (15) switch between a positive supply voltage level (V$_{BAT}$) and a reference voltage (V$_{HSGND}$) level smaller than the positive supply voltage level (V$_{BAT}$).

6. Method for providing data processed by an integrated circuit (10) at an output pin (2) of the integrated circuit (10) with the power specified for the output pin (2) of the integrated circuit (10) according to any of the claims 1 to 5, wherein the method comprises the following steps: Use the charge stored in the capacity of a first MOSFET (MP$_1$) of a dynamic switch-on stage (11) to charge the capacity of a output MOSFET (MPo) at its gate contact to switch the output MOSFET (MPo) at the output pin (2) from its non-conductive condition into its conductive condition at a switch-on time (T$_1$) at the occurrence of a positive edge of the processed data (D);

Maintain the condition of the output MOSFET (MPo) with a static driver stage (9) until the dynamic driver stage (8) switches the condition;

Use a dynamic switch-off stage (12) to discharge the capacity of the output MOSFET (MPo) at its the gate contact to switch the output MOSFET (MPo) at the output pin (2) from its conductive condition into its non-conductive condition at the switch-off time (T$_2$) at the occurrence of a negative edge of the processed data (D).

The invention claimed is:

1. An integrated circuit comprising:
a central processing unit built to process data;
an output pin of the integrated circuit to provide processed data at the output pin to an external device connected to the output pin; and
a driver for the output pin with an output MOSFET of the driver connected to the output pin to provide the processed data with power specified for the output pin, wherein the driver comprises:
 a dynamic driver stage built to switch the output MOSFET between a conductive condition of the output MOSFET and a non-conductive condition of the output MOSFET; and
 a static driver stage built to maintain the condition of the output MOSFET until the dynamic driver stage switches the condition.

2. The integrated circuit according to claim 1, wherein:
 the dynamic driver stage comprises a dynamic switch-on stage to switch the output MOSFET from the non-conductive condition into the conductive condition at a switch-on time at an occurrence of a positive edge of the processed data; and
 the dynamic driver stage comprises a dynamic switch-off stage to switch the output MOSFET from the conductive condition into the non-conductive condition at a switch-off time at an occurrence of a negative edge of the processed data.

3. The integrated circuit according to claim 2, wherein the dynamic switch-off stage is built to steer a second MOSFET of the driver connected to a gate contact of the output MOSFET into its conductive condition to discharge a capacity of the output MOSFET at its gate contact to switch the output MOSFET into its non-conductive condition.

4. The integrated circuit according to claim 3, wherein the static driver stage comprises a second inverter connected with its input to the gate contact of the output MOSFET and connected with its output to the input of a third inverter, which third inverter is connected with its output via a resistor to the gate contact of the output MOSFET, wherein the second inverter and the third inverter switch between a positive supply voltage level and a reference voltage level smaller than the positive supply voltage level.

5. The integrated circuit according to claim 2, wherein:
 the dynamic switch-on stage comprises a first MOSFET of the same technology as the output MOSFET with a source contact and drain contact of the first MOSFET connected to the output of a first inverter of the dynamic switch-on stage, which first inverter at its input receives the processed data; and
 a charge stored in a capacity of the first MOSFET at switch-on time is used to charge a capacity of the output MOSFET at its gate contact to switch the output MOSFET into its conducting condition.

6. The integrated circuit according to claim 5, wherein the dynamic switch-off stage is built to steer a second MOSFET of the driver connected to the gate contact of the output MOSFET into its conductive condition to discharge the capacity of the output MOSFET at its gate contact to switch the output MOSFET into its non-conductive condition.

7. The integrated circuit according to claim 5, wherein the static driver stage comprises a second inverter connected with its input to the gate contact of the output MOSFET and connected with its output to the input of a third inverter, which third inverter is connected with its output via a resistor to the gate contact of the output MOSFET, wherein the second inverter and the third inverter switch between a positive supply voltage level and a reference voltage level smaller than the positive supply voltage level.

8. The integrated circuit according to claim 2, wherein the static driver stage comprises a second inverter connected with its input to a gate contact of the output MOSFET and connected with its output to the input of a third inverter, which third inverter is connected with its output via a resistor to the gate contact of the output MOSFET, wherein the second inverter and the third inverter switch between a positive supply voltage level and a reference voltage level smaller than the positive supply voltage level.

9. The integrated circuit according to claim 1, wherein the static driver stage comprises a second inverter connected with its input to a gate contact of the output MOSFET and connected with its output to the input of a third inverter, which third inverter is connected with its output via a resistor to the gate contact of the output MOSFET, wherein the second inverter and the third inverter switch between a positive supply voltage level and a reference voltage level smaller than the positive supply voltage level.

10. A method for providing data processed by an integrated circuit at an output pin of the integrated circuit with the power specified for the output pin of the integrated circuit according to claim 1, wherein the method comprises:

using a charge stored in a capacity of a first MOSFET of a dynamic switch-on stage to charge a capacity of the output MOSFET at its gate contact to switch the output MOSFET at the output pin from its non-conductive condition into its conductive condition at a switch-on time at an occurrence of a positive edge of the processed data;

maintaining the condition of the output MOSFET with the static driver stage until the dynamic driver stage switches the condition; and using a dynamic switch-off stage to discharge the capacity of the output MOSFET at its gate contact to switch the output MOSFET at the output pin from its conductive condition into its non-conductive condition at a switch-off time at an occurrence of a negative edge of the processed data.

* * * * *